United States Patent [19]
Gaffur et al.

[11] Patent Number: 5,789,786
[45] Date of Patent: Aug. 4, 1998

[54] HIGH-VOLTAGE CMOS TRANSISTORS ON A STANDARD CMOS WAFER

[75] Inventors: Husam Gaffur, San Jose; Sukyoon Yoon, Sunnyvale, both of Calif.

[73] Assignee: National Semiconductor Corporation, Santa Clara, Calif.

[21] Appl. No.: 756,004

[22] Filed: Nov. 25, 1996

Related U.S. Application Data

[62] Division of Ser. No. 429,182, Apr. 26, 1995, Pat. No. 5,578,855, which is a continuation of Ser. No. 196,417, Feb. 15, 1994, abandoned.

[51] Int. Cl.$^6$ .................................................. H01L 29/72
[52] U.S. Cl. ........................... 257/369; 257/371; 257/375; 257/376; 257/408
[58] Field of Search ................................. 257/369, 371, 257/375, 376, 408

[56] References Cited

U.S. PATENT DOCUMENTS

| | | | |
|---|---|---|---|
| Re. 34,158 | 1/1993 | Watanabe et al. | 257/370 |
| 4,525,920 | 7/1985 | Jacobs et al. | 29/571 |
| 4,761,384 | 8/1988 | Neppl et al. | 437/29 |
| 4,818,719 | 4/1989 | Yeh et al. | 437/57 |
| 4,918,026 | 4/1990 | Kosiak et al. | 437/33 |
| 5,229,308 | 7/1993 | Vo et al. | 437/31 |
| 5,578,855 | 11/1996 | Gaffur et al. | 257/371 |

FOREIGN PATENT DOCUMENTS

| | | | |
|---|---|---|---|
| A1 0 248 988 | 12/1987 | European Pat. Off. | H01L 21/82 |
| A2 0 331 233 | 9/1989 | European Pat. Off. | G03F 7/10 |
| A2 0387 999 | 9/1990 | European Pat. Off. | H01L 21/82 |
| A 2 675 311 | 10/1992 | France . | |
| A 56-118 366 | 12/1981 | Japan | H01L 27/08 |
| A 60-66461 | 8/1985 | Japan | H01L 27/08 |
| A2-112 271 | 7/1990 | Japan | H01L 27/06 |
| A2-138 756 | 8/1990 | Japan | H01L 27/06 |

OTHER PUBLICATIONS

Parpia, Z. et al., "Modeling and Characterization of CMOS–Compatible High–Voltage Device Structures," IEEE Transactions on Electron Devices, vol. ED–34, No. 11, Nov. 1987, pp. 2335–2343.

Gilles, T. et al., "High–Voltage Technology Offers New Solutions for Interface Intergrated Circuits, "IEEE Transactions on Electron Devices, Vol. ED–33, No. 12, Dec. 1986, pp. 2016–2024.

Primary Examiner—Edward Wojciechowicz
Attorney, Agent, or Firm—Limbach & Limbach L.L.P.

[57] ABSTRACT

A low-voltage 0.8-micron CMOS process is modified by implanting arsenic or phosphorus during epitaxy in a p-type substrate starting material to increase the depth of selected n-well areas for the purpose of producing high-voltage transistors on the same substrate in the same CMOS process. Implanting boron in a p-field extension area in a manner which minimizes the dopant in the adjacent field oxide achieves a similar result. That is, breakdown and punch-through voltages are increased. Together, these make CMOS transistors which operate at a higher voltage range than either innovation alone.

20 Claims, 2 Drawing Sheets

HIGH-VOLTAGE CMOS TRANSISTORS ON A STANDARD CMOS WAFER

This is a divisional of application Ser. No. 08/429,182, filed Apr. 26, 1995, now U.S. Pat. No. 5,578,855, which is a continuation of application Ser. No. 08/196,417, filed Feb. 15, 1994, now abandoned.

BACKGROUND OF THE INVENTION

1. Field of the Invention

The present invention relates to an apparatus of high-voltage (over 6 volts) transistors and diodes on the same substrate and made in the same process as ordinary 5-volt CMOS (Complementary Metal Oxide Semiconductor) circuits and to a process for making the apparatus. More particularly, but not by way of limitation, the present invention allows logic circuitry to be fabricated in existing CMOS processes, while allowing interfacing to high-voltage circuits on the same silicon substrate.

2. Discussion

High-voltage capability has important applications in consumer electronics, automotive and other markets where many existing devices such as motors, transducers and actuators operate on high voltages. The present invention allows the logic circuitry to operate on power-saving low voltage while allowing the entire device to be fabricated on a single silicon chip in an otherwise conventional CMOS process. For the purpose of this discussion, low voltage is a voltage of 6 volts and less, while high voltage is a voltage of over 6 volts.

Conventional CMOS logic integrated circuits (hereinafter CMOS chips) operate between 2.4 and 5 volts. The range of power supply voltages at which the chip can operate is known as the operating voltage range. Typically a given chip can simply be powered with any power supply selected between 1.2 and 5 volts and the logic will operate with a logic low of 0 volts and logic high of the selected power supply voltage. Typically for battery-operated devices and other devices where a minimum of power consumption is desirable, the lowest possible voltage is used. Although the use or this low voltage minimizes the power consumed, existing physical devices such as motors, transducers, and actuators operate advantageously at higher voltages. Moreover, the trend is toward CMOS chips that operate at even lower voltages while these other components stay at their fixed voltages, and may even operate more efficiently at higher voltages.

The areas in which high-voltage CMOS chips will be useful are numerous. Applications in LCD active matrix technology, linear amplifiers, voltage translators, switching regulators, computer interfaces including the ubiquitous RS-232 interface and in computer disk drive read/write circuits are in need of this innovation. Numerous other applications will suggest themselves when the device becomes commercially available and thereby well-known. In short, any application which involves operating voltages outside of the presently limited range will benefit from the device. Moreover, as the geometry of the CMOS chips continues to shrink in size, the operating voltage range will be in even lower voltages which will greatly increase the need for the present invention.

As an example, an automobile may have a microprocessor controller that drives a 12-volt motor. For the purpose of this example, assume the motor does a particular physical task and therefore requires the same power output of 120 Watts, regardless of supply voltage. If the motor draws 10 Amperes of current through connections that through age and neglect have a resistance of 0.1 ohms, the power consumed in these connections is 10 Watts. On a 24-volt system, a motor of the same locomotive power would draw only 5 Amperes, dissipating only 2.5 Watts as heat. Similarly on a 6-volt system, the power dissipated as heat would be 40 Watts, a substantial fraction of the motor's power of 120 Watts. The ratio of power wasted to power consumed for the 6, 12, and 24-volt systems is, respectively, 33%, 8%, and 2%. This illustrates how a widely used system, the electrical system of automobiles, is unlikely to go to any lower voltage because of increasing inefficiency in the system as the voltage is decreased.

CMOS chips, on the other hand, have become more efficient at lower voltages. The 4000B series CMOS operates between 5 and 15 volts and has been widely used for over twenty years. However, it accomplishes its high-voltage range by using much larger transistors than are used in current CMOS submicron geometries. As device size was reduced and new CMOS series introduced, the operating voltage range dropped until today, as an example, the 4-bit National Semiconductor COP424C CMOS microcontroller draws 3.5 milliwatts when operated at 5 volts, but only 0.29 milliwatts at 2.4 volts. Unfortunately for the car manufacturers, the upper limit of the supply voltage for this microcontroller is only 6 volts. Moreover, as modern fabrication techniques reduced device size, the typical maximum operating voltage has decreased. Using a 6-volt controller on a 12-volt system presently requires surrounding the chip with various external interface transistors at additional cost.

The additional transistors, required for the purpose of interfacing to the high voltage circuitry, became necessary as the same CMOS device miniaturization that decreased voltage and power requirements also decreased the depth of the semiconductor wells thereby decreasing the punch-through and breakdown voltages, giving rise to the lowered maximum operating voltages. The punch-through voltage of a CMOS gate is the voltage applied across the source and drain which, in and of itself and without regard to the voltage on the gate, causes significant current flow through the source and drain. Because the current flows without regard for the voltage on the gate of the device, the device is no longer functional. Moreover, the power dissipated by the device in such a condition typically destroys the device. The punch-through voltage is therefore the measure of how great a voltage can be switched by a given transistor. The breakdown voltage is analogously defined as the voltage between the gate and drain or between the gate and source which causes significant current flow through the gate. Insomuch as a CMOS transistor has an insulated gate, this too represents a breakdown of the transistor's function.

In a diode, which has only one junction, only the breakdown voltage is defined. The breakdown voltage is the voltage which reverse-biases the diode and causes significant current to flow through the diode. Unless the current is limited by external means, catastrophic overheating and subsequent destruction of the diode occurs. Because the diode has only one junction, punch-through voltage is not defined for the diode. Consequently, throughout this application, where the term punch-through occurs, the term is understood as applying only to transistors and its application to diodes is a nullity.

The punch-through and breakdown voltages in an integrated circuit are functions of the physical three-dimensional geometry of the circuit. If the resultant electric field within a device exceeds certain bounds, catastrophic electrical breakdown occurs based on the electric field and the device geometry. The geometry is controlled by the extent to and rate at which various dopants diffuse into a given substrate. Such dopants include boron, phosphorus, and arsenic.

The relative diffusion rates of the various dopants are important factors in determining the final device geometry. Different dopants diffuse at different rates and because diffusability is a steep function of temperature, the depth of diffusion is not a linear function of the time for which and temperature to which the wafer is heated. Because of this nonlinearity, heating the wafer twice for the same cumulative time does not produce the same depth of diffusion as heating the wafer once. Therefore, although the various thermal cycle times are stated and are in fact done to accomplish a particular task, the effect on the diffusion of the dopant is also a key issue in the ultimate placement of the doped regions. Consequently, final device geometry depends to a large extent on the overall sequence of events comprising the manufacture of the chip.

A need exists for, and the present invention is directed toward, a process that overcomes these shortcomings of the current CMOS apparatus of the conventional low voltage CMOS process and allows high-voltage devices to be fabricated on existing low-voltage submicron CMOS production lines.

SUMMARY OF THE INVENTION

In the present invention, a low-voltage 0.8-micron CMOS process is modified by implanting a selected dopant during epitaxy in a p-type substrate starting material to increase the depth of selected n-well areas for the purpose of producing high-voltage transistors on the same substrate in the same CMOS process.

The present invention is accomplished by growing an epitaxial layer on a selected substrate, and implanting a dopant type into the epitaxial layer at a selected time during growth of the epitaxial layer to produce an implant zone to increase the breakdown and punch-through voltages. Next, a negatively doped n-well region is produced within the epitaxial layer, and a layer of field oxide is grown at selected sites on the epitaxial layer. The next step is implanting source and drain regions within the n-well region with such regions separated by the field oxide for electrical insulation. Finally, a polysilicon gate is deposited between the source and drain regions.

In one embodiment of the present invention, the dopant type is arsenic which is implanted after completion of about 90 percent of the epitaxial layer. In another embodiment, the dopant type is phosphorus which is implanted after, or near, the completion of the growth of the epitaxial layer.

An object of the present invention is to provide high-voltage CMOS transistors and diodes on the same substrate and manufactured in the same process as low-voltage CMOS transistors.

Another object of the present invention is to eliminate at the circuit board level, extra interface integrated circuits (ICs) by providing for translation to high-voltage on a low-voltage CMOS IC.

Yet another object of the present invention is to enable the high-voltage transistors needed to interface with liquid crystal and other displays and line drivers for RS-232 and other interface to he manufactured in the same process and in the same substrate as low-voltage CMOS transistors.

Another object is to provide such advantages in other interface circuits such as those found in disc drives.

Other objects, features and advantages of the present invention will become apparent from the following detailed description when read together with the drawings and appended claims.

Figure 1:
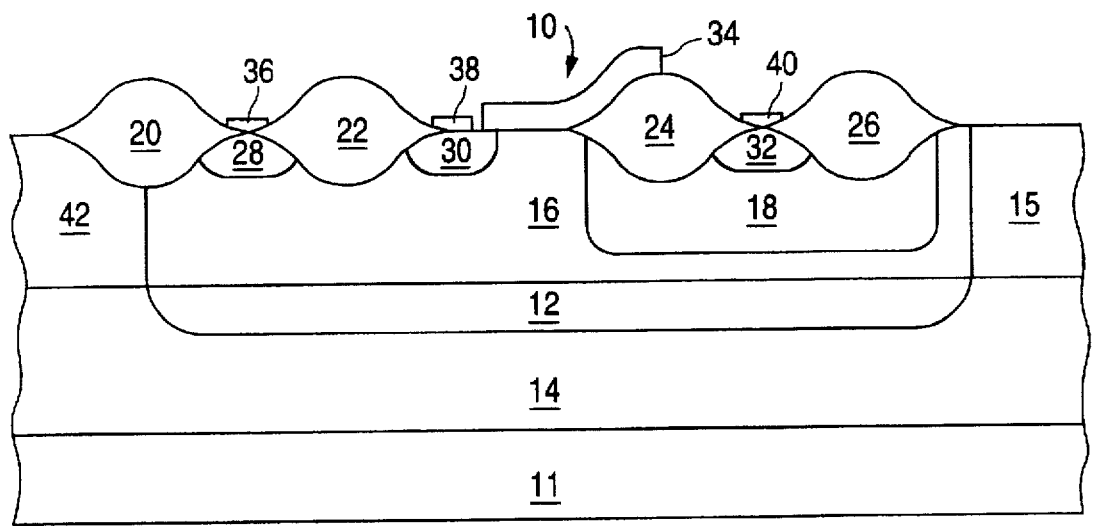
FIG. 1 depicts a transistor made according to the present invention.

Referring now to the drawings and more particularly to FIG. 1, shown therein is a cross-section of a high voltage PMOS transistor 10 manufactured from a low-voltage CMOS process modified in accordance with the present invention.

As with conventional CMOS transistors, the transistor 10 shown in FIG. 1 contains an n-well 16 supporting a source region 30, a drain region 32, a polysilicon gate 34, and field oxide regions 20, 22, 24 and 26. Metallized contact 36 provides electrical access to an n-well contact region 28 and metallized contacts 38 and 40 provide access to the source and drain regions 30, 32 respectively. As can also be seen in FIG. 1, transistors selected to possess the aforementioned high voltage characteristics are additionally provided with a buried layer 12 in a first epitaxial layer 14 over a substrate 11. The buried layer 12 comprises a heavily doped n+ region which is juxtaposed below the n-well 16 which is located in a second epitaxial layer 15 above the first epitaxial layer 14. Additionally, a p-field extension region 18 is provided within the n-well 16 below the drain region 32.

The buried layer 12 and the p-field extension region 18 each operate separately and independently to raise the breakdown and punch-through voltage thresholds of the transistor 10 which increases the operating voltage range of the transistor 10. The buried layer 12 serves to provide an improved conduction path for current to flow between the source region 30 and the drain region 32 during operation of the device. The p-field extension region 18 effectively improves the cross-sectional area of a conductive path between the source and drain regions 30, 32, reducing constraints upon an electric field generated during operation of the device in the region adjacent to the drain region 32. Further, the combined operation of the buried layer 12 and the p-field extension region 18 significantly increase the breakdown and punch-through voltage threshold of the transistor 10 over and above the increase achieved by either the buried layer 12 or the p-field extension region 18 alone.

Figure 2:
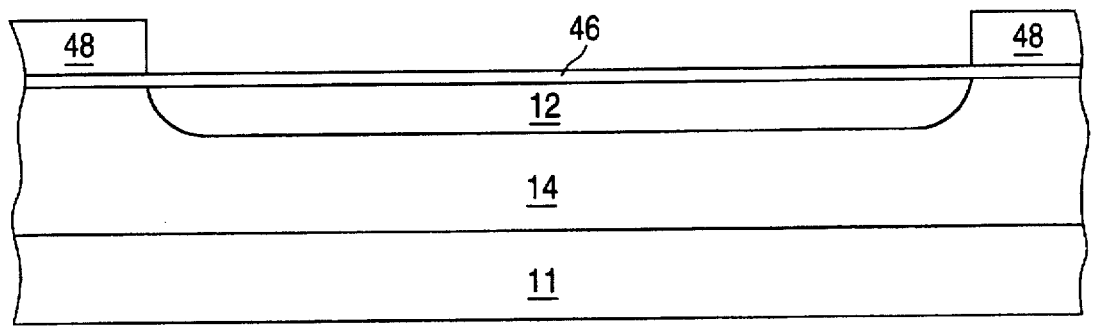
FIG. 2 is an arsenic implant in an epitaxial layer.

The high voltage PMOS transistor 10 may be fabricated using the method described below in conjunction with FIGS. 2–5. Referring to FIG. 2, shown therein is a p-type substrate 11 having a crystallographic orientation of <100> and on which is grown the aforementioned first epitaxial layer 14, which comprises a layer of silicon about 22 µm in thickness grown or deposited expitaxially on the substrate 11. The first epitaxial layer 14 is provided with a thin layer of oxide 46 which is formed over the epitaxial layer 14 during the epitaxial process and has a thickness of about 120 Å. A mask 48 is applied to the layer of oxide 46, exposing those locations where the high voltage transistors 10 are to be formed and enabling the implanting of an n-type impurity into the epitaxial layer 14 to form the buried layer 12. In the preferred embodiment, arsenic is implanted at this step in the process at an energy of 160 KeV and driven in at 1000 degrees Celsius for about 21 minutes, resulting in a concentration of $10^{13}$ to $10^{14}$ atoms/cm$^2$ in the buried layer 12. It should be noted, however, that concentrations above this range may also yield desirable results.

Figure 3:
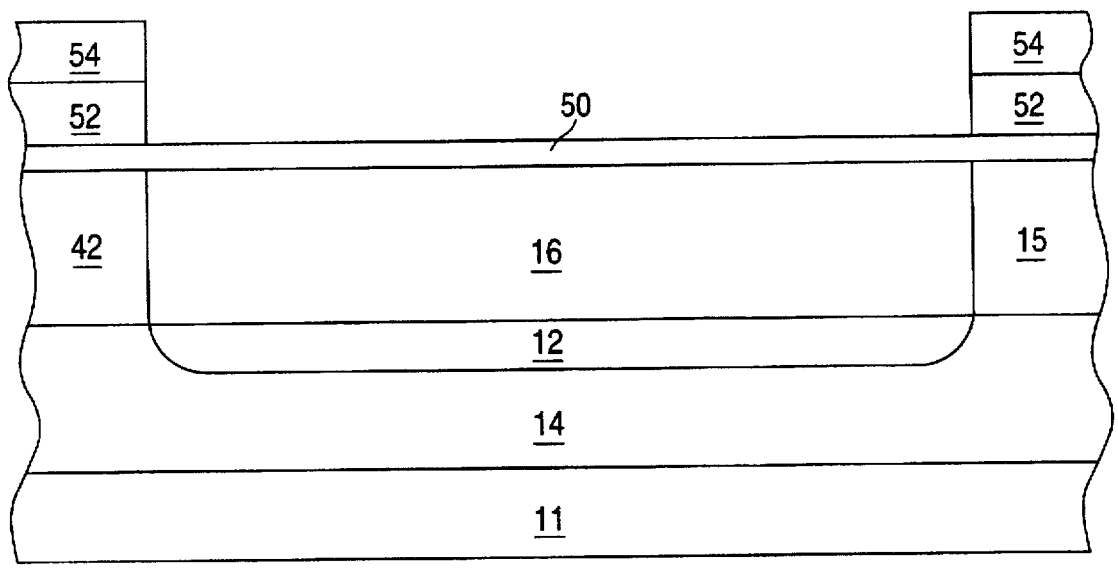
FIG. 3 shows exposed twin well pad oxide before removal of photoresist.

Referring to FIG. 3, the mask 48 and the layer of oxide 46 are removed and a second epitaxial layer 15 is subsequently grown or deposited over the first epitaxial layer 14. This second epitaxial layer 15 is grown or deposited until it achieves a thickness of about 1.8 μm, after which a pad oxide 50 is grown over the second epitaxial layer 15, the pad oxide 50 having a thickness of about 450 Å.

It should be noted that in an alternative embodiment, phosphorus may be used instead of arsenic as the n-type impurity for the above described buried layer 12. In such a case, the buried layer 12 is not formed until after the second epitaxial layer 15 and the pad oxide 50 have been completed. The alternative phosphorus buried layer process steps comprise masking the pad oxide 50, implanting phosphorus at an energy of from 140 KeV to 200 KeV and driving in at an elevated temperature for about 11 hours to achieve a resulting concentration of about $10^{16}$ to $10^{17}$ atoms/cm$^2$ in the first epitaxial layer 14. The remaining process steps are the same whether arsenic or phosphorus is used in forming the buried layer 12.

A layer of silicon nitride 52 is deposited on the pad oxide 50 to a depth of about 1350 Å and photoresist 54 is then applied to expose the layer of silicon nitride 52 over locations that will subsequently become n-wells 16. The exposed portions of the layer of silicon nitride 52 are removed using a suitable etchant process and phosphorus having an energy of 140 KeV is implanted to achieve a concentration of about $4.5 \times 10^{12}$ atoms/cm$^2$ to form the n-well 16. FIG. 3 depicts the relevant part of the silicon wafer at this step in the process.

The photoresist 54 is stripped and the remaining portions of the layer of silicon nitride 52 are used in the local oxidation of silicon (LOCOS), wherein oxide (not shown in FIG. 3) is grown to a depth of about 5000 Å during exposure to 1200 degrees Celsius dry heat. The remaining portions of the layer of silicon nitride 52 are then removed and p-wells 42 are formed in the second epitaxial layer 15 by the implantation of BF$_2$ at an energy of 150 KeV to achieve a concentration of $2.7 \times 10^{12}$ atoms/CM$^2$.

The oxide is selectively etched back such that oxide with a thickness of about 2400 Å remains over the n-well 16 and oxide with a thickness of about 1850 Å remains over the p-well 42. The n-well 16 and the p-well 42 are then driven in by heating the wafer to 1150 degrees Celsius for sufficient time to increase the depth of the n-well 16 to about 1.8μm and the depth of the p-well 42 to about 2.0μm. The difference in these two depths is largely attributable to the differences in the diffusion rates of the respective dopants.

Figure 4:
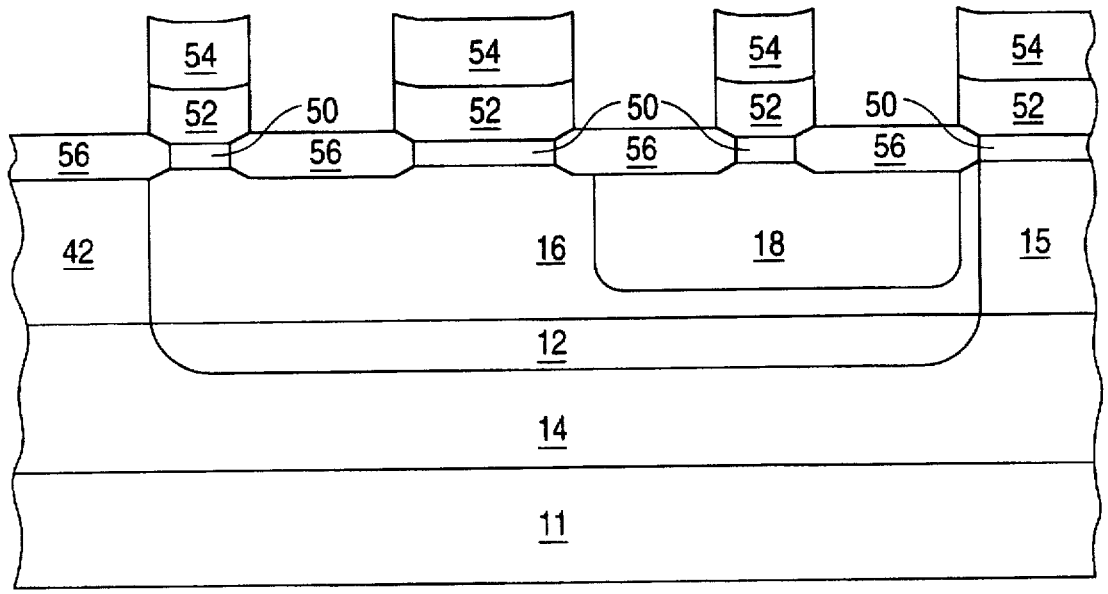
FIG. 4 depicts a step of local oxidation of silicon wherein boron is implanted.
Figure 5:
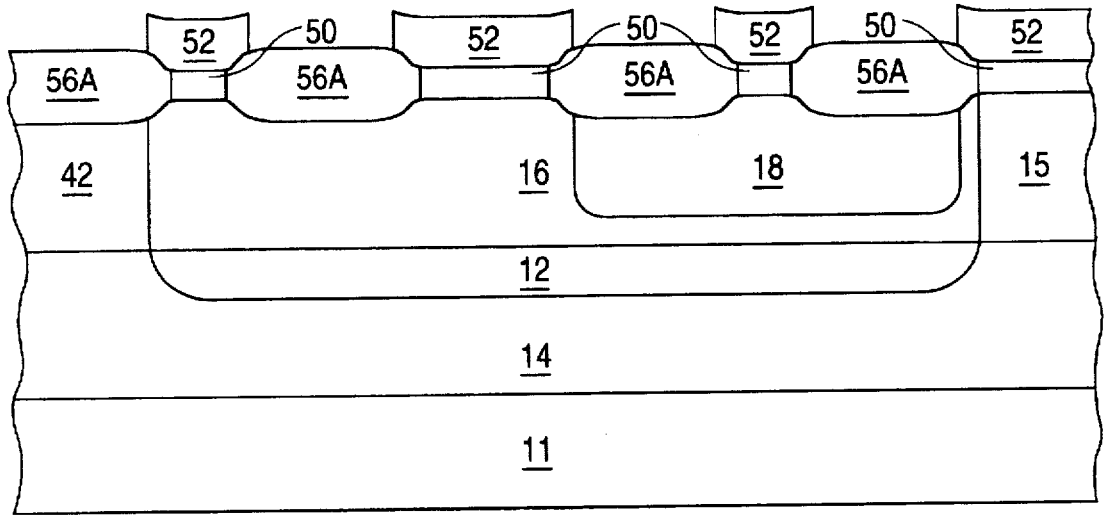
FIG. 5 depicts the completion of local oxidation of silicon after the boron implant is made.

Referring now to FIG. 4, the following additional process steps are performed. 200 Å pad oxide 50, 1850 Å composite nitride 52, and photoresist 52 are formed as follows: the 200 Å of pad oxide 50 and the 1850 Å composite nitride 52 are deposited in the locations shown. A layer of photoresist 54 is spun on and exposed using a mask to achieve the pattern shown in FIG. 4 and the photoresist 54 is developed. Next, the nitride 52 is etched and the photoresist is cleaned, after which the pad oxide 50 is etched and about 3250 Å of field oxide 56 is grown. Another layer of photoresist 54 is spun on and exposed to provide p-field extension mask through which BF$_2$ is implanted at an energy of 140 KeV to achieve a concentration of $5.5 \times 10^{13}$ atoms/cm$^2$. The photoresist 54 is removed and additional field oxide is grown to achieve a thickness of about 6500 Å, which is shown as field oxide 56A in FIG. 5.

The remaining steps in the process required to complete the transistor 10, as shown in FIG. 1, are similar to those used in conventional CMOS technology. The composite nitride 52 and the composite oxide 50 are removed and a 200 Å gate oxidation and a voltage threshold implant are performed. The polysilicon gate 34, as shown in FIG. 1, is formed by depositing 4000 Å polysilicon. Resist is then spun on the front side of the wafer and the polysilicon is etched in a plasma process and the backside oxide is removed by a buffered etchant. The polysilicon is doped by phosphorus to a concentration of about $10^{20}$ to $10^{21}$ atoms/cm$^2$, deglazed, and etched by conventional processes, resulting in the gate 34 shown in FIG. 1. Seal oxidation to seal the poly at the sides and to protect the surface of the silicon is then formed with a thickness of 80 Å by exposing the wafer to 900 degrees Celsius dry heat for about 50 minutes.

The n-well contact region 28 (an n+ diffusion area) is formed, followed by the source and drain regions 30, 32 (which are p+ diffusion areas). A drain contact (not particularly shown) is formed using conventional LDD techniques and a LDD blocking mask (not shown), allowing the implanting of phosphorus at an energy of 50 KeV to a dose of $2.3 \times 10^{13}$ atoms/cm$^2$. At this point the ohmic contact has an n-doping. Next, 2000 Å spacers are formed by oxidation of the silicon. The spacers are then etched back for the purpose of completing the LDD. The n+ blocking mask is then used to expose only the n+ ohmic contact to arsenic ions implanted at an energy of 40 KeV to a concentration of $3.0 \times 10^{15}$ atoms/cm$^2$. The resist is removed and poly oxidation (not shown) is performed to a depth of 150 Å. Another mask is used to expose the two areas that become the source and drain regions 30 and 32 which are doped with BF$^2$ at an energy of 45 KeV to a dose of $4.5 \times 10^{15}$ atoms/cm$^2$, after which the resist is removed.

The next major step in the process is dielectric deposition. First, 500 Å of undoped plasma oxide is deposited, then BPSG is deposited to a depth of 6000 Å. The BPSG is reflowed by reheating to a temperature of 900 degrees Celsius for a time suitable to achieve the desired profile. Cap deposition is formed by oxidizing to a depth of 2000 Å.

The final step in the process is to form the metallic contacts 36, 38 and 40. Contact cuts are made using the contact mask, followed by a layer of titanium being deposited to a depth of 1000 Å. Titanium nitride is formed to a depth of about 150 Å and titanium silicide is formed to a thickness of 300 Å. Tungsten is then deposited to a depth of 7500 Å. The combination of these metal layers is then masked and etched to form the metallic contacts 36, 38 and 40, completing the formation of the silicon structure as shown in FIG. 1.

Having concluded a description of the method of the present invention, it is important to note that in addition to the formation of a high voltage transistor 10 as hereinabove described, a high voltage diode may also be formed and used in the manner provided by using the metallic contact 40, as shown in FIG. 1, as an anode connection and the metallic contact 36 as a cathode connection. The operation of the buried layer 12 and the p-field extension region 18 serve to increase the operating voltage range of such a diode in the same manner as for the transistor 10.

The above description makes clear that the present invention is well adapted to carry out the objects and to attain the ends and advantages mentioned herein as well as those inherent in the invention. While presently preferred embodiments of the invention have been described for purposes of this disclosure, it should be understood that numerous changes may be made which will readily suggest themselves to those skilled in the art and which are encompassed within the spirit of the invention disclosed and as defined in the appended claims.

What is claimed is:

1. A semiconductor device formed on a semiconductor substrate of a first conductivity type, the semiconductor substrate having a dopant concentration, the device comprising:

an epitaxial layer of the first conductivity type formed on the substrate, the epitaxial layer having a top surface, an opposed bottom surface in contact with the substrate, and a dopant concentration that is less than the dopant concentration of the substrate;

a first region of a second conductivity type formed in the epitaxial layer, the first region having a top surface coincident with the top surface of the epitaxial layer, an opposed bottom surface, and a dopant concentration;

a second region of the second conductivity type formed in the epitaxial layer, the second region adjoining the bottom surface of the first region, being spaced apart from the bottom surface of the epitaxial layer, and having a dopant concentration which is greater than the dopant concentration of the first region;

a third region of the first conductivity type formed in the first region, the third region having a dopant concentration that is less than the dopant concentration of the substrate;

a fourth region of the first conductivity type formed in the third region, the fourth region having a dopant concentration that is greater than the dopant concentration of the third region; and a fifth region formed in the first region, the fifth region being spaced apart from the fourth region.

2. The device of claim 1 wherein the fifth region has the second conductivity type, and a dopant concentration that is greater than the dopant concentration of the first region.

3. The device of claim 2 and further comprising an isolation region formed in the third region between the fourth region and the fifth region, the isolation region being spaced apart from the fifth region.

4. The device of claim 3 wherein a distance measured from an edge of the isolation region closest to the fifth region to an edge of the fifth region is substantially equal to a distance from an edge of the third region closest to the fifth region to the edge of the fifth region.

5. The device of claim 1 wherein the fifth region has the first conductivity type, and a dopant concentration that is greater than the dopant concentration of the third region.

6. The device of claim 5 and further comprising:

a channel region defined in the first region between the third region and the fifth region;

a layer of gate oxide formed over the channel region; and a gate formed over the layer of gate oxide.

7. The device of claim 6 and further comprising an isolation region formed in the third region between the channel region and the fifth region, the isolation region being spaced apart from the fifth region.

8. The device of claim 7 wherein a distance measured from an edge of the isolation region closest to the fifth region to an edge of the fifth region is substantially equal to a distance from an edge of the third region closest to the fifth region to the edge of the fifth region.

9. The device of claim 1 wherein the fourth region includes a drain and the fifth region includes a source.

10. A semiconductor device formed on a semiconductor substrate of a first conductivity type, the semiconductor substrate having a dopant concentration, the device comprising:

a first epitaxial layer of the first conductivity type formed on the semiconductor substrate, the first epitaxial layer having a dopant concentration that is less than the dopant concentration of the substrate;

a first region of a second conductivity type formed in the first epitaxial layer, the first region having a dopant concentration;

a second epitaxial layer of the first conductivity type formed on the first epitaxial layer and the first region;

a second region of a second conductivity type formed in the second epitaxial layer, the second region contacting the first region and having a dopant concentration which is less than the dopant concentration of the first region;

a third region of the first conductivity type formed in the second region, the third region having a dopant concentration;

a fourth region of the first conductivity type formed in the third region, the fourth region having a dopant concentration that is greater than the dopant concentration of the third region; and a fifth region formed in the second region.

11. The device of claim 10 wherein the fifth region has the second conductivity type, and a dopant concentration that is greater than the dopant concentration of the first region.

12. The device of claim 11 and further comprising an isolation region formed in the third region between the fourth region and the fifth region, the isolation region being spaced apart from the fifth region.

13. The device of claim 12 wherein a distance measured from an edge of the isolation region closest to the fifth region to an edge of the fifth region is substantially equal to a distance from an edge of the third region closest to the fifth region to the edge of the fifth region.

14. The device of claim 10 wherein the fifth region has the first conductivity type, and a dopant concentration that is greater than the dopant concentration of the third region.

15. The device of claim 14 and further comprising:

a channel region defined in the second region between the third region and the fifth region;

a layer of gate oxide formed over the channel region; and a gate formed over the layer of gate oxide.

16. The device of claim 15 and further comprising an isolation region formed in the third region between the channel region and the fifth region, the isolation region being spaced apart from the fifth region.

17. The device of claim 16 wherein a distance measured from an edge of the isolation region closest to the fifth region to an edge of the fifth region is substantially equal to a distance from an edge of the third region closest to the fifth region to the edge of the fifth region.

18. A semiconductor device formed on a semiconductor material of a first conductivity type, the device comprising:

a first region of a second conductivity type formed in the semiconductor material;

a second region of the first conductivity type formed in the first region;

a third region of the first conductivity type formed in the second region, the third region having a dopant concentration that is greater than a dopant concentration of the second region;

a fourth region formed in the first region, the fourth region being spaced apart from the third region; and an isolation region formed in the second region between the third region and the fourth region, the isolation region being spaced apart from the fourth region, a distance measured from an edge of the isolation region closest to the fourth region to an edge of the fourth region is substantially equal to a distance from an edge of the second region closest to the fourth region to the edge of the fourth region.

19. The device of claim 18 wherein the fourth region has the second conductivity type and a dopant concentration greater than a dopant concentration of the first region.

20. The device of claim 18 wherein the fourth region has the first conductivity type and a dopant concentration greater than a dopant concentration of the second region.

* * * * *